United States Patent [19]

Johnson

[11] Patent Number: 4,896,118
[45] Date of Patent: Jan. 23, 1990

[54] VARIABLE GAIN CURRENT-TO-VOLTAGE AMPLIFIER WITH GAIN INDEPENDENT TEST MODE OPERATION

[75] Inventor: Richard A. Johnson, Murrysville Boro, Pa.

[73] Assignee: Westinghouse Electric Corp., Pittsburgh, Pa.

[21] Appl. No.: 262,846

[22] Filed: Oct. 26, 1988

[51] Int. Cl.[4] .............................................. G01R 19/00
[52] U.S. Cl. ........................................ 330/2; 324/616
[58] Field of Search .............. 330/2; 324/57 R, 158 T

[56] References Cited

U.S. PATENT DOCUMENTS 3,718,857 2/1973 Bernard ............................ 324/57 R Primary Examiner—James B. Mullins

[57] ABSTRACT

The present invention provides a precision variable gain current-to-voltage amplifier which has a test mode of operation wherein the gain is independent of the gain of the amplifier when operated in the normal amplification mode. The invention enables a test signal, preferably a test voltage, to be injected into the amplifier circuit to test the functioning of the op amp and thus the amplifier. Because the gain of the amplifier in the test mode is independent of the gain of the amplifier when in the normal mode, a simple and easy method of checking the functioning of the op amp is provided which does not require knowing the gain of the amplifier and then selecting the proper test input to use.

18 Claims, 3 Drawing Sheets

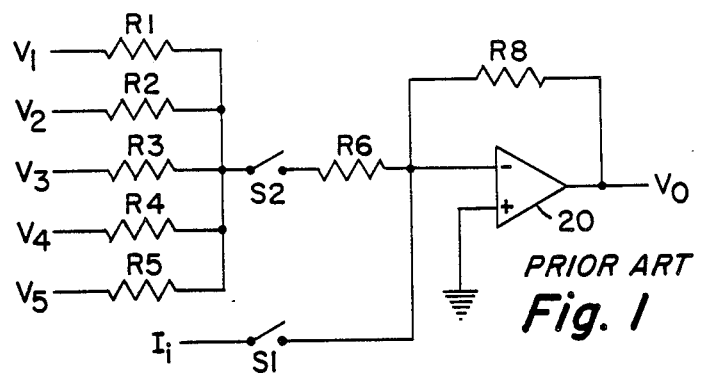
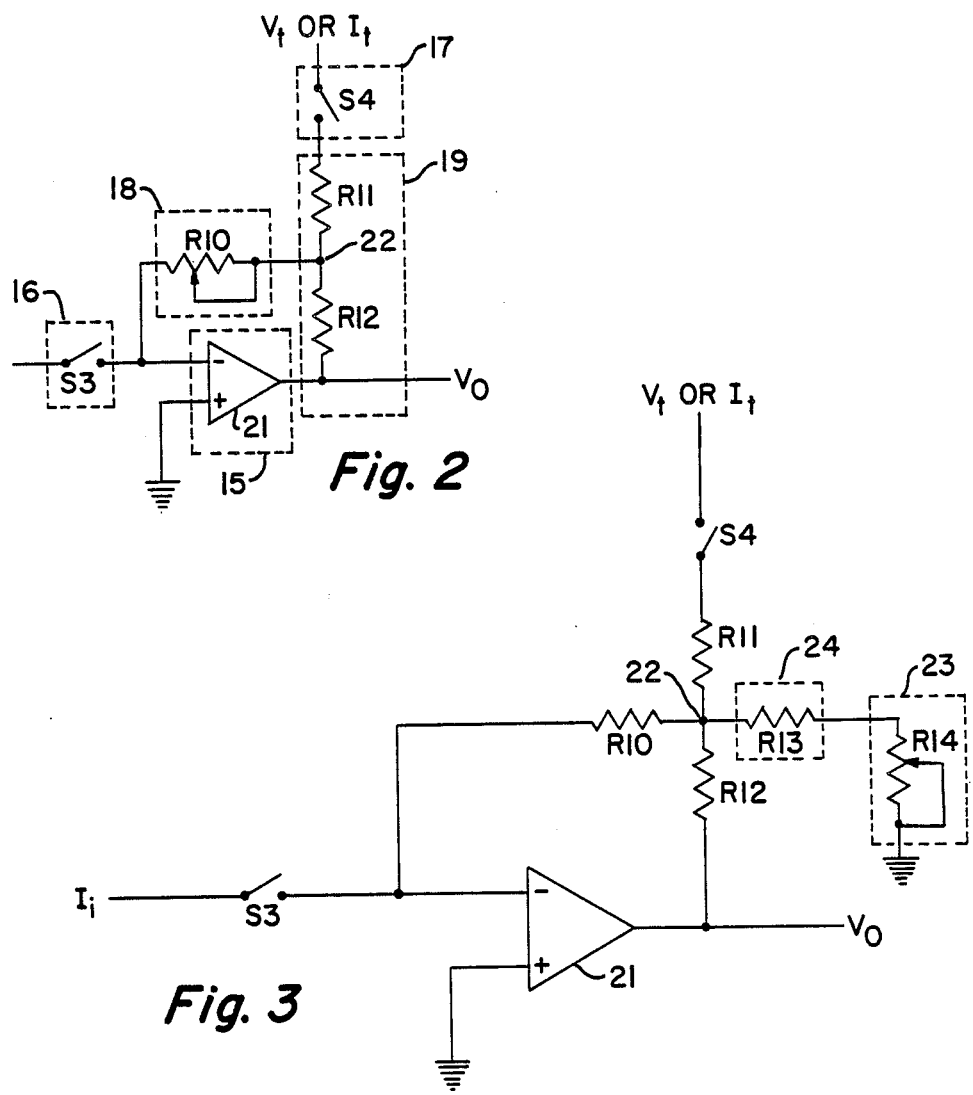
Fig. 1 PRIOR ART
Fig. 2
Fig. 3

VARIABLE GAIN CURRENT-TO-VOLTAGE AMPLIFIER WITH GAIN INDEPENDENT TEST MODE OPERATION

FIELD OF THE INVENTION

The present invention relates to a precision current-to-voltage amplifier having an adjustable gain in the normal mode of operation and more particularly to one also having a test mode of operation wherein test signals can be injected into the amplifier to verify that it is still operating.

BACKGROUND OF THE INVENTION

Current-to-voltage amplifiers are used widely in today's electronics. They are used with very small input currents such as $1\times10^{-6}$A to $1\times10^{-11}$A. Often, however, it is necessary to determine whether a current-to-voltage amplifier is functioning properly. This is particularly the case in nuclear instrumentation systems. It is very important to know if the active component of the amplifier, i.e., the operational amplifier ("op amp") is working properly.

A known current-to-voltage amplifier is shown in FIG. 1. In the normal mode of operation, switch S1 is closed and switch S2 is open. The gain of the amplifier is determined by resistor R8 with the relationship being $V_o = 31$ R8·$I_i$. If R8 is variable or adjustable, such as by being a potentiometer or a set of resistors which alternately can be switched into the circuit, the gain of the amplifier becomes adjustable. R8 can have almost any value but typically is between 100Ω and 100MΩ. To monitor whether the amplifier is functioning properly, it can be operated in a test mode wherein switch S1 is open and switch S2 is closed. Depending upon the value of R8 and thus the gain of the amplifier, a test input current is applied by selecting from one of a series of voltage sources and corresponding resistors, $V_1$ to $V_5$ and R1 to R5, respectively. The values of $V_1$ to $V_5$ and R1 to R5 are varied so as to produce a range of test current values which when multiplied by R8 do not exceed the output capability of op amp 20.

The disadvantage with this test configuration is that the test input current chosen depends upon the gain of the amplifier. In normal operations, R8 is variable and is typically chosen from a set of resistors of many different values depending upon the range of the current being amplified. Depending upon what resistor value R8 currently has, a different test input current is required to test the operation of the amplifier without putting op amp 20 into saturation. As a result, several different voltage source values ($V_1$–$V_5$) and resistors (R1–R5) are needed to generate the different test currents. This of course, complicates the circuitry and increases the number of electronic components necessary. It also means that one must know the value of R8 before a test input current is applied so that the correct value can be chosen.

It would be desirable, therefore, to have a precision current-to-voltage amplifier which did not require a variety of test inputs, but used only one, and which, in the test mode of operation, had a fixed gain independent of the gain of the amplifier in the normal mode of operation.

SUMMARY OF THE INVENTION

Generally, the present invention relates to a current-to-voltage amplifier having a normal mode of operation wherein the amplifier has an adjustable gain (i.e. normal gain) and also having a test mode of operation wherein the amplifier has a fixed gain independent of the adjustable gain in the normal mode. The invention provides an easy way to verify the operation of the active component(s) of the amplifier and thus the amplifier itself, independent of the normal gain of the amplifier. This feature is particularly important since the gain of the amplifier can vary widely. In prior amplifiers, such as shown in FIG. 1, the gain would need to be known to change the correct test input. This is not necessary in the present invention since in the test mode of operation, the gain of the amplifier is independent of the normal gain. Thus, only one test input is necessary, thereby reducing the complexity of the circuitry and the number of the components used therein.

The current-to-voltage amplifier of the present invention comprises: an active component, preferably an op amp; a first switch means connected between the input current $I_i$ and the active component; and an adjustable amplification means, preferably a set of resistors which alternatively can be switched into the circuit or a variable resistor such as a potentiometer, connected to the active component in an amplifier configuration; and a test input divider connected between a second switch means and the amplifier output such that the adjustable amplification means is connected to the amplifier output through a portion of the test input divider, and wherein the second switch means is connected between the test input and the test input divider and the second switch means and the first switch means are not both closed at the same time.

Preferably, the active component and the adjustable amplification means are arranged in the standard amplifier configuration. If the active component is an op amp and the amplification means is a resistor, the resistor is connected between the negative input of the op amp and a mid portion of the test input divider. The test input divider comprises a plurality of resistors connected in series, preferably two resistors, one connected between the amplifier output and the adjustable amplification means and the other between the adjustable amplification means and the second switch which connects the test input to the second switch which connects the test input to the amplifier circuit.

In the normal mode of operation, the first switch is closed, connecting the input to the amplifier and the second switch is open, disconnecting the test input from the amplifier. In normal operation, the amplifier gain is determined by the value of the adjustably amplification means and the second portion of the test input divider. If, however, the value of the test input divider is relatively small compared to the value of the adjustable amplification means, the amplification value is determined primarily by the value of the adjustable amplification means.

When the first switch is opened, the input is disconnected and when the second switch is closed, the test input is connected. In this configuration, the current through the first portion of the test input divider must equal the current through the second portion of the input test divider since no current flows through the adjustable amplification means. Thus, the amplitude of the test input current equals the amplifier output current. Preferably, the two resistors of the test input divider are chosen to be equal so that the amplitudes of the test input voltage and the test output voltage are equal, if the op amp is working properly. If the op amp is not, the test input voltage will not equal the test output voltage. Thus, the present invention provides an easy way to verify the operation of a precision current-to-voltage amplifier.

In another embodiment, a gain limiting means and a second adjustable amplification means are connected in series with each other and are connected to the first adjustable amplification means at the mid portion of the test input divider. In this configuration, the gain limiting means preferably is a resistor which prevents the op amp from saturating. The second adjustable amplification means is provided because it allows a fixed precision resistor to be substituted for the first adjustable amplification means, thereby providing a more accurate amplifier while at the same time providing the necessary adjustability in the gain of the amplifier.

Other details, objects and advantages of the present invention will become more readily apparent from the following description of a presently preferred embodiment thereof.

BRIEF DESCRIPTION OF THE DRAWINGS

In the accompanying drawings, a preferred embodiment of the present invention is illustrated, by way of example only, wherein:

FIG. 1 shows a prior art current-to-voltage amplifier which can be operated in a test mode;

FIG. 2 shows a current-to-voltage amplifier of the present invention; and

FIG. 3 shows another embodiment of the current-to-voltage amplifier of the present invention.

DESCRIPTION OF THE PREFERRED EMBODIMENT

Figure 4:
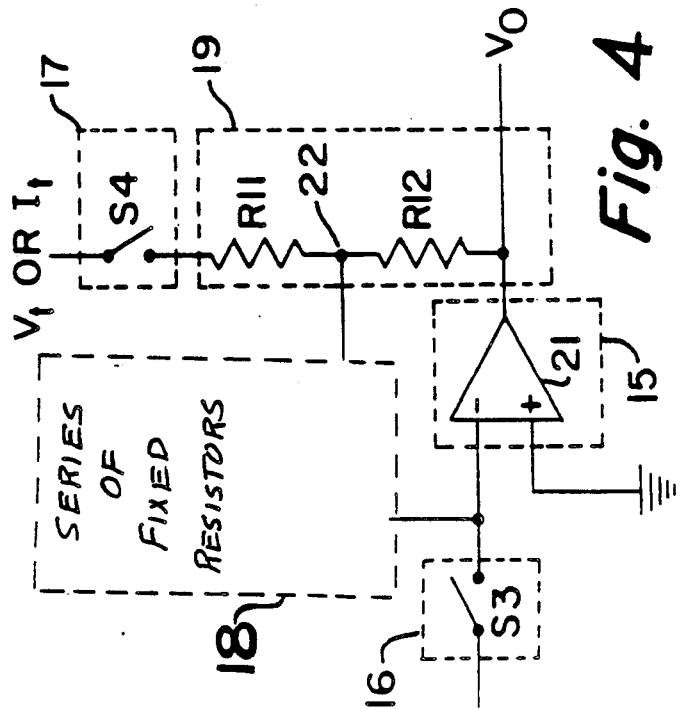
FIG. 4 shows a current-to-voltage amplifier similar to that shown in FIG. 2 except that a series of fixed resistors is used instead of a potentiometer.

Generally, the present invention provides a current-to-voltage amplifier having a field adjustable gain in the normal mode of operation to accommodate different full scale ranges of input signals. The amplifier also has a test mode of operation with a fixed gain independent of the amplifier gain in the normal mode of operation which simplifies and facilitates the automatic testing of the amplifier and its functioning.

The operation of the present invention is best described in connection with the embodiments shown in FIGS. 2 and 3. As shown in FIG. 2, the precision current-to-voltage amplifier uses an op amp 21 as the active component 15. Preferably, the op amp has a very low input offset and input bias current characteristics such as an OPA111 made by Burr Brown. Various designs of switches S3 and S4 can be used as the first switch means 16 and the second switch means 17, respectively. These switches determine whether the amplifier is operating in the normal mode or the test mode. In the embodiment of FIG. 2, one variable resistor R10 is used as the adjustable amplification means 18 while R11 and R12 form the test input divider 19. This circuit can use a test current or a test voltage as the test input and preferably R11 is substantially equal to R12. In the normal mode of operation, switch S3 is closed connecting input $I_i$, and switch S4 is open disconnecting the test input ($V_t$ or $I_t$).

In this configuration, the gain of the amplifier is given by the following equation:

$$V_o/I_i = -(R10+R12) \quad (1)$$

Depending upon the values chosen for R10 and R12, the range of input current $I_i$ which can be detected and amplified varies from $1\times10^{-11}$A to $1\times10^{-4}$A. R10 can be a potentiometer as shown in FIG. 2 or a series of fixed resistors which alternately can be connected together in various configurations to form the desired value of R10 as shown in FIG. 4. R10 typically varies from 1K to 100MΩ to obtain the amplification needed for the different ranges of input current $I_i$. If R10>>R12, the gain of the amplifier in the normal mode is essentially R10 as can be seen from Equation (1). Preferably, R11=R12 and are about 20K, although other values can be used.

In the test mode operation, switch S3 is open disconnecting the input current $I_i$, and switch S4 is closed, connecting the test input ($V_t$ or $I_t$). With a very low offset voltage (typically 50 μV) and a very low input bias current to the inverting input of op amp 21 (typically $1\times10^{-12}$ A), the voltage at the common connection 22 of the test input divider and the adjustable amplification means is essentially ground. This is because no current flows through R10 and the inverting and positive inputs of op amp 21 are at the same voltage, namely ground. The transfer function for the test input is given by the following equations:

$$V_o = -R12 \cdot I_t \text{ or} \quad (2)$$

$$V_o = -(R12/R11)(V_t) \quad (3)$$

depending upon whether a test voltage or test current is used. As can be seen from Equations (2) and (3), the output voltage $V_o$ in the test mode is independent of the adjustable gain R10. Also, as can be seen from Equation (3), if R12=R11, then $V_o = -V_t$. Thus, the operation of the amplifier can easily be checked in the test mode with a test voltage by comparing if the magnitude output voltage $V_o$ equals the magnitude of the test input voltage $V_t$. If it does, op amp 21 is functioning properly. This comparison can easily be implemented with a comparator. If $V_o \neq -V_t$, an error signal can be sent to a control panel to notify an operator.

A second embodiment of the present invention is shown in FIG. 3. In this configuration, rather than varying the value of R10, R10 is fixed and the value of R14 is varied. R14 is the second adjustable amplification means 23 while R13 is used as a gain limiting means 24. R13 is not necessary but as can be seen from Equation (4) it keeps the theoretical gain from becoming infinite, especially if R14 is switched out of the circuit.

For the circuit shown in FIG. 3, the gain transfer function in the normal mode of operation is given by the following equation:

$$V_o/I_i = -[R10+(1+R10/(R13+R14))R12] \quad (4)$$

Figure 5:
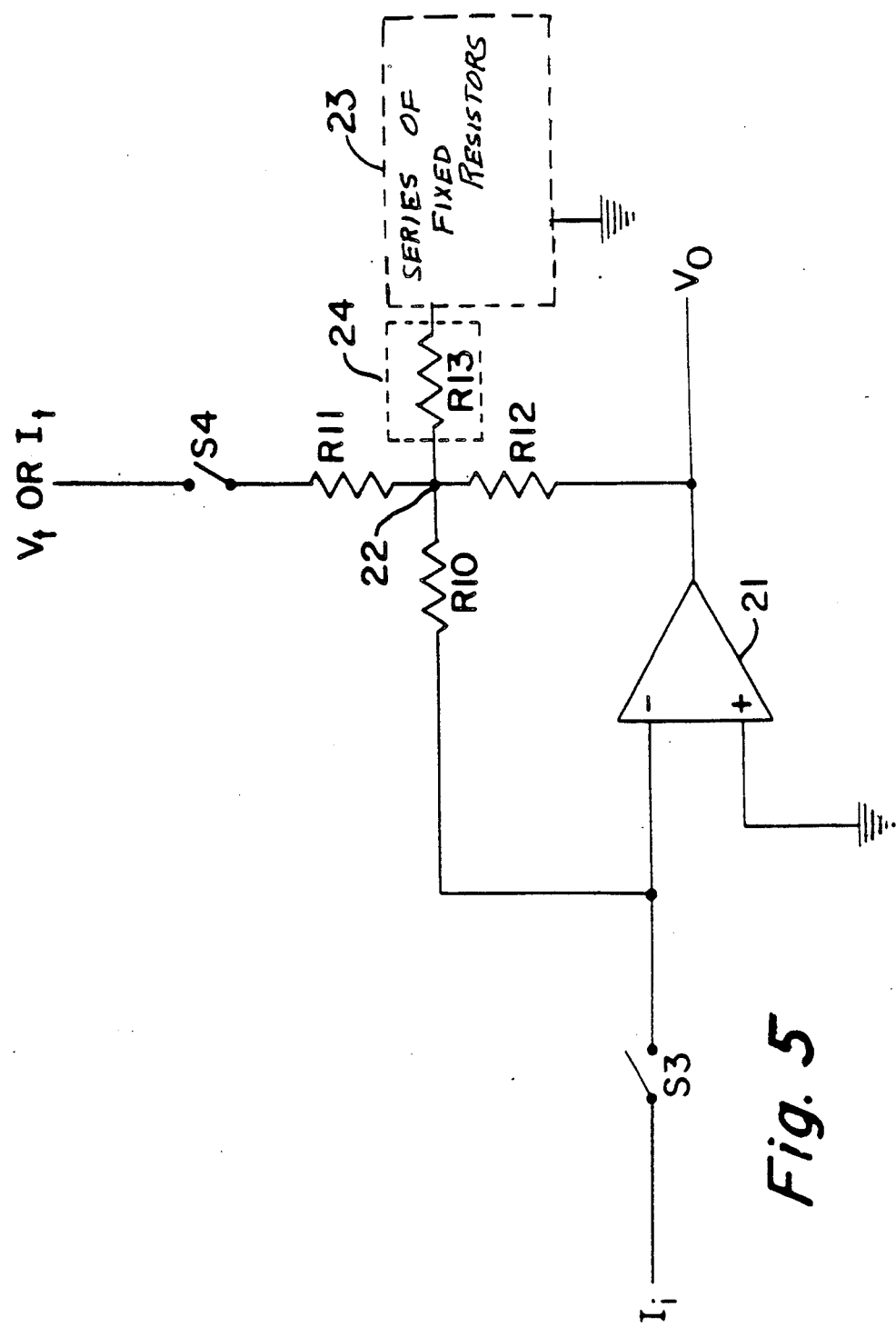
FIG. 5 shows a current-to-voltage amplifier similar to that shown in FIG. 3 except that a series of fixed resistors is used instead of a potentiometer.

Typical values for these resistors are 1K≦R10≦ 100 MΩ, R11=20 K, R12=20 K, R13=182Ω and 100Ω≦R14 ≦1K. In this circuit, R14 is variable, being either a potentiometer as shown in FIG. 3 or a set of fixed resistors which can be connected in the circuit in a variety of configurations to obtain different values for R14 as shown in FIG. 5. As long as R14 is a potentiometer, R13 is not necessary. R13, however, is needed if R14 is made from a plurality of resistors which are alternately switched into the circuit. Typical values for the resistors used to form R14 include 182Ω, 221Ω, 332Ω, 715Ω, 1.6KΩ, 5.6KΩ and 5.1 MΩ. If R13 and R14 are removed from the circuit (i.e. they become very large), the circuit of FIG. 3 becomes like the one in FIG. 2 and Equation (4) reduces to Equation (1).

In the test mode of operation for the circuit shown in FIG. 3, common point 22 is again at ground potential and the operation of the amplifier in the test mode is the same as that described in connection with FIG. 2. In this configuration, almost no current flows through R10 or R13 and R14, and to the extent any does, it is only the zero offset currents due to the op amp and these are present all the time.

The present invention has the added advantage that it can be used to measure the zero offset of op amp 21 due to bias currents and input offset voltages. This can be done by opening both switches S3 and S4. Then the measured output voltage is the zero offset voltage due to these error sources. Since superposition principles apply when switch S3 is closed and current $I_f$ flows, the value of the zero offset voltage can be subtracted from any output voltage measurement to obtain a more accurate reading.

While a presently preferred embodiment of practicing the invention has been shown and described with particularity in connection with the accompanying drawings, the invention may otherwise be embodied within the scope of the following claims.

What is claimed:

1. A precision current-to-voltage amplifier having a normal amplification mode wherein an input current is amplified by an adjustable gain to produce an output voltage corresponding thereto and also having a test mode wherein the output voltage is independent of the normal amplification gain comprising:
   (a) an active component;
   (b) a first switch means connected between the input current and the active component;
   (c) a first adjustable amplification means connected in an amplifier configuration to the active component;
   (d) a test input divider connected to the output voltage such that the adjustable amplification means is connected to the output voltage through a portion of the test input divider; and
   (e) a second switch means connected between a test input and the test input divider, the second switch means and the first switch means not both being closed at the same time.

2. The amplifier as described in claim 1 wherein the active component is an operational amplifier.

3. The amplifier as described in claim 2 wherein the test input divider comprises a plurality of resistors, one of which is connected between the adjustable amplification means and the output voltage.

4. The amplifier as described in claim 3 wherein the plurality of resistors comprise two resistors, the second one being connected between the adjustable amplification means and the second switch means.

5. The amplifier as described in claim 4 wherein the two resistors in the test input divider are substantially equal.

6. The amplifier as described in claim 5 wherein the test input is a voltage.

7. The amplifier as described in claim 3 wherein the test input is a current.

8. The amplifier as described in claim 3 wherein the adjustable amplification means comprises a plurality of resistors, each of which alternatively can become part of the amplifier configuration.

9. The amplifier as described in claim 3 wherein the adjustable amplification means comprise a potentiometer.

10. A precision current-to-voltage amplifier having a normal amplification mode wherein an input current is amplified by an adjustable gain to produce an output voltage corresponding thereto and also having a test mode wherein the output voltage is independent of the normal amplification gain comprising: (a) an active component; (b) a first switch means connected between the input current and the active component; (c) a fixed amplification means connected in an amplifier configuration to the active component; (d) a test input divider connected to the output voltage such that the fixed amplification means is connected to the output voltage through a portion of the test input divider; (e) a second switch means connected between a test input and the test input divider, the second switch means and the first switch means not both being closed and the same time; and (f) a gain limiting means connected in series with an adjustable amplification means which are connected to the fixed amplification means at a mid-portion of the test input divider.

11. The amplifier as described in claim 10 wherein the adjustable amplification means is a potentiometer.

12. The amplifier as described in claim 10 wherein the adjustable amplification means comprises a plurality of resistors, each of which alternatively can become part of the amplifier configuration.

13. The amplifier as described in claim 10 wherein the active component is an operational amplifier.

14. The amplifier as described in claim 13 wherein the test input divider comprises a plurality of resistors, one of which is connected between the gain limiting means and the output voltage.

15. The amplifier as described in claim 14 wherein the plurality of resistors comprise two resistors, the second one being connected between the gain limiting means and the second switch means.

16. The amplifier as described in claim 15 wherein the two resistors in the test input divider are substantially equal.

17. The amplifier as described in claim 16 wherein the test input is a voltage.

18. The amplifier as described in claim 16 wherein the test input is a current.

* * * * *